(12) United States Patent
Houston

(10) Patent No.: US 6,483,739 B2
(45) Date of Patent: Nov. 19, 2002

(54) 4T MEMORY WITH BOOST OF STORED VOLTAGE BETWEEN STANDBY AND ACTIVE

(75) Inventor: Theodore W. Houston, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/035,923

(22) Filed: Dec. 31, 2001

(65) Prior Publication Data
US 2002/0105824 A1 Aug. 8, 2002

Related U.S. Application Data
(60) Provisional application No. 60/259,276, filed on Dec. 31, 2000.

(51) Int. Cl.$^7$ .............................. G11C 11/00
(52) U.S. Cl. .................. 365/154; 365/156; 365/230.06
(58) Field of Search ................ 365/154, 156, 365/230.06

(56) References Cited

U.S. PATENT DOCUMENTS 5,453,949 A * 9/1995 Wiedmann et al. ......... 365/154
5,583,821 A * 12/1996 Rose et al. ................. 365/156

* cited by examiner

*Primary Examiner*—Huan Hoang
(74) *Attorney, Agent, or Firm*—Peter K. McLarty; W. James Brady III; Frederick J. Telecky, Jr.

(57) ABSTRACT

In a 4T SRAM cell, voltage states of nodes during transition to active is boosted to provide stability and allow lower power consumption standby states.

5 Claims, 2 Drawing Sheets

| STAND BY | WAKE-UP | ACTIVE |
|---|---|---|
| Wordline relatively high | Lower wordline some amount | Keep wordline fully "low" |
| Allows high node to sag | Brings high node back high | Cells don't upset on read |
| Low power | Takes 2-3 cycles | High power |

4T MEMORY WITH BOOST OF STORED VOLTAGE BETWEEN STANDBY AND ACTIVE

This application claims the benefit of No. 60/259,276, filed Dec. 31, 2000.

BACKGROUND AND SUMMARY OF THE INVENTION

The present invention relates to integrated circuit structures and fabrication methods, particularly to storage cells.

BACKGROUND

Loadless SRAMs have been an important recent development in memory technology. Like conventional 4T or 6T SRAMs, loadless SRAMs include a "latch" (a cross-coupled pair of driver transistors) whose state corresponds to the stored data; but conventional SRAMs must have a load of some sort to maintain the state of the latch. (In a conventional 4T SRAM cell the load is provided by a special high-impedance element, which complicates fabrication; in a conventional 6T SRAM cell the load is provided by another pair of cross-coupled transistors, of opposite type to the driver transistors.) Loadless SRAMs do not have any such load: instead, the data state is maintained merely by leakage current through the pass transistors.

To maintain the data state, the leakage current into the high node must be greater than the leakage current through the driver transistor which connects the high node to ground. Actually, to maintain the data state, the leakage into and out of the high storage node must balance at a high enough storage node voltage to maintain the high node voltage higher than the low node voltage with the cross-coupling, with allowance for variation in transistor characteristics and the possibility of noise coupling.

4T Memory with Boost of Stored Voltage Between Standby and Active

Advantages of the disclosed methods and structures, in various embodiments, can include one or more of the following:

lower standby power consumption.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

The IDDQ (quiescent current) in 4T loadless storage cells can be reduced by maintaining the high side of the memory at a relatively low voltage. Cells with a relatively low high side are more apt to be upset on read, however. The present innovations use a set up time in transition from standby to active, where the high nodes are restored to a higher voltage before being accessed. In the preferred embodiment, this is done by dipping the wordline before the start of the active cycle, which raises the high node voltage in a 4T SRAM cell with PMOS pass transistors.

Figures 1, 2:
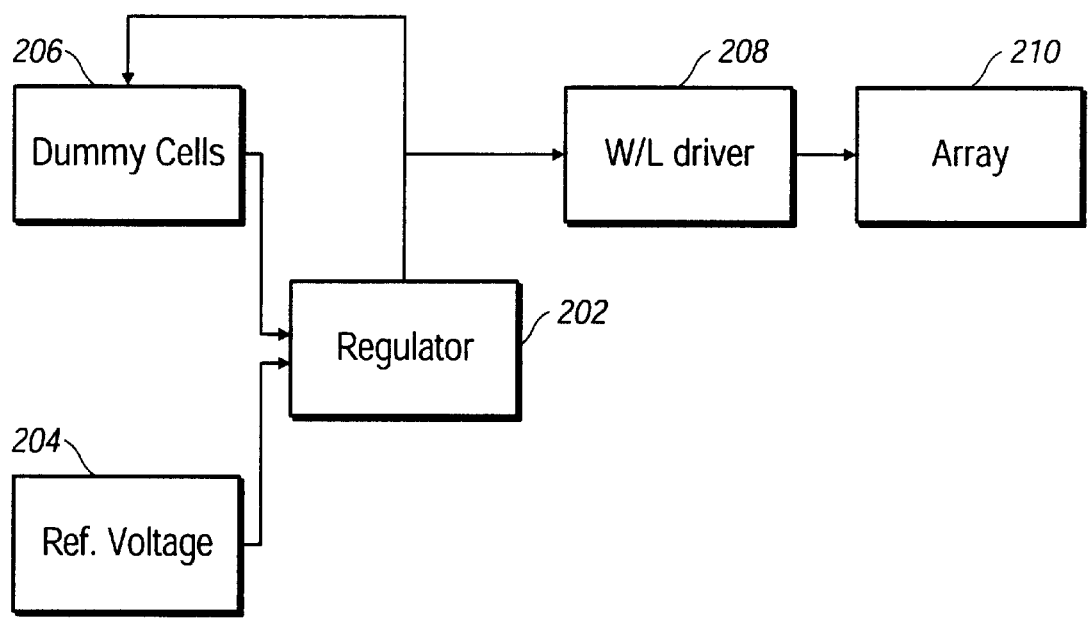
FIG. 1 shows a chart of various storage cell states and their characteristics in the preferred embodiment.
FIG. 2 shows a block diagram of the components of the innovative storage system.

FIG. 1 shows a process chart showing characteristics of three different phases of memory storage for a 4T SRAM cell with PMOS pass transistors. In standby, the wordline is kept relatively high, which allows the high node's voltage level to sag, or decrease. This consumes less power than keeping the nodes at higher voltages during standby. Since most of a memory cell's lifetime is spent in standby mode, this power consumption is important.

During the active stage, the unaccessed wordlines may be kept low as required to maintain a high storage node voltage such that storage cells are not upset when addressed. This is higher power consumption, but is necessary to keep the cells stable when accessed. In wake-up, the word lines are lowered sufficiently to bring the high storage nodes to a high voltage. The WL voltages in wake-up may be lower than the unaccessed WL's in active in order to accomplish the restoration of high storage node voltages more quickly. The WL voltage in wake up is not brought down quickly enough nor far enough to cause upsets of the stored information.

FIG. 2 shows a configuration designed to adjust the wordline-off voltage to maintain stored "high" voltage relative to some reference. A regulator 202 is connected to a reference voltage source 204 and dummy cells 206 to monitor the voltage levels to keep them at their minimum possible value without upsetting. The wordline driver 208 accordingly maintains the array's 210 wordline at the proper voltage. The reference voltage can be lower in standby than in active since the cells are not accessed during standby, and therefore are less subject to upset.

Figure 3:
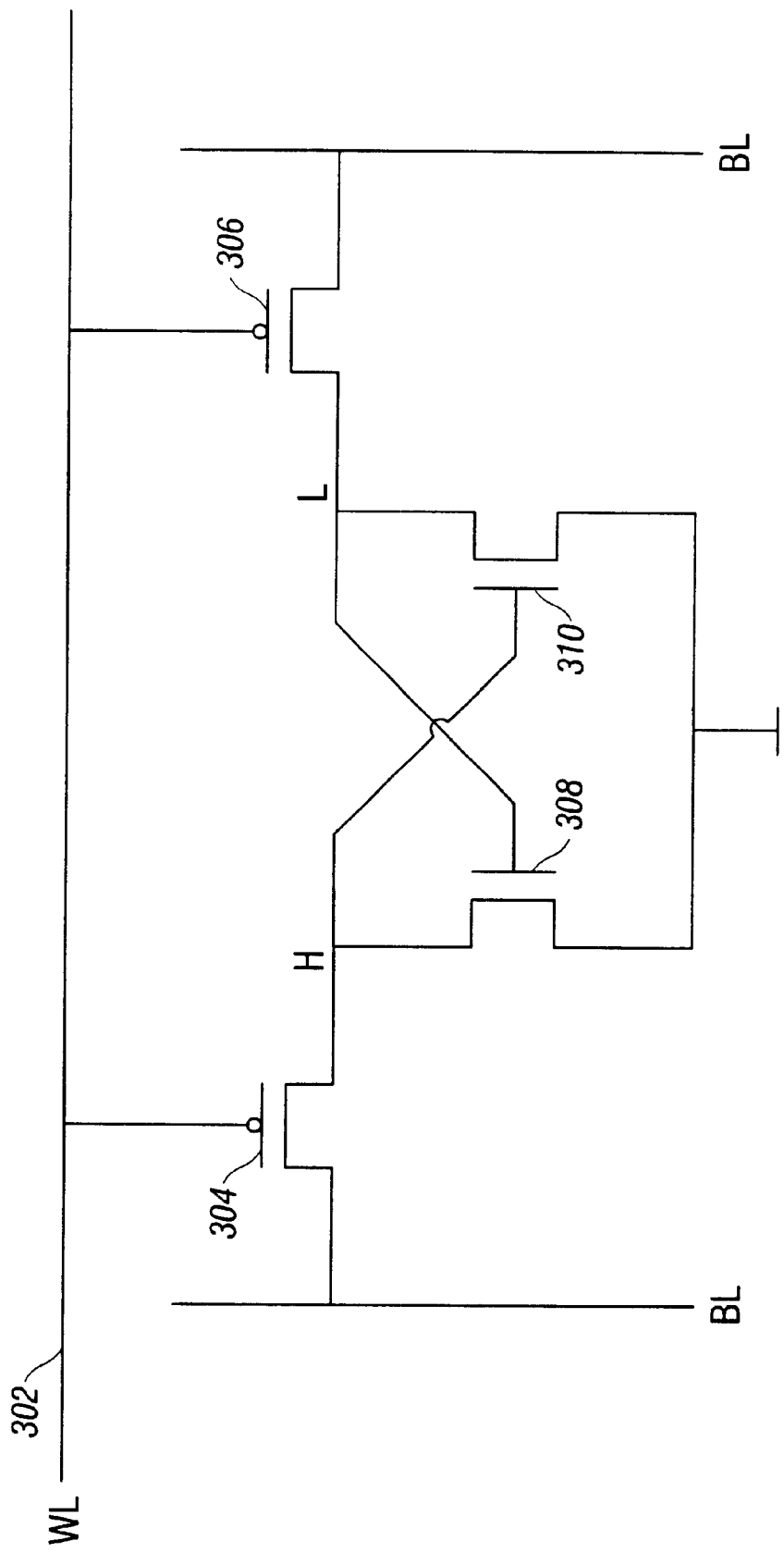
FIG. 3 shows a 4T loadless storage cell for use with the preferred embodiment.

FIG. 3 shows a 4T SRAM loadless memory cell for use in the preferred embodiment. The wordline 302 connects to the pass transistors 304, 306, whose leakage controls voltage levels on the high storage node (gate of drive transistors 310). The high node (marked "H") must maintain a minimum voltage during standby in order to be stable. The high side must be high enough to turn on drive transistor 310 sufficiently to keep the low side low. In standby, the wordline is kept relatively high, which allows the high node's voltage to sag to a minimum level and still maintain its state. During transition to active, instead of immediately allowing dropping the wordline voltage to its minimum (or accessed) value, the wordlines are dipped, which allows all the storage nodes to reach more stable, higher voltage states before being exposed to possible state-disturbing accesses.

With the subthreshold current of the n and p transistors adjusted to keep the high side high (either with threshold voltages or wordline voltage), there is more leakage to the low side because there is more voltage across that pass gate. The lower the high side is allowed to go (that is, the more the leakage to the high side is reduced), the greater the reduction in leakage tot he low side.

A dc voltage on the wordline to maintain the high side at a minimum voltage level will give the lowest IDDQ. This is compared to pulse or saw tooth voltages on the wordline that keep the high side above some minimum value, but raise it above that minimum value periodically. The less the wordline is lowered to raise the high side above its minimum, the lower the IDDQ. No matter what the WL control mechanism in standby, if it is designed to lower IDDQ in standby relative to IDDQ in active, the high node will be allowed to go lower than required for stability in active.

Low IDDQ can be obtained in a 4T SRAM by allowing the high storage node to drop in standby, and then have a restore when entering active by dipping the wordline voltage. This requires that the system allow some time for the restore to transition from standby to active.

The high storage node can be allowed to go down to some minimum value that will still allow sufficient margin for restore. That is, there must be enough differential between the high and low sides. If the high side is at or above Vtn, it is high enough to maintain the low side against the pass gate leakage. Even a high side somewhat lower than Vtn may be adequate.

In the active cycle, a higher storage node voltage is needed because when the WL is turned on for access, the high bit line tends to pull the low side high. Adequate conditions for the active mode are achieved by restoring the higher voltage (by dipping the wordline voltage) in transition from standby to active. This also requires restoration in some segment of the active cycle.

In 4T SRAM storage, the transistors need to maintain some minimum storage node high that is on the order of 1–2 Vtn. If a higher voltage is used, power is being wasted. For some conditions, especially those with a high Vtn, a higher than necessary storage node voltage will be maintained even with the wordline at Vdd. To lower the IDDQ in these cases, the wordline can be raised above Vdd. An alternative to this is to lower the bitline voltage. This would require the control scheme to lower the bitline voltage as low as possible with the wordline at Vdd, and switch to the case of the bitline at Vdd and lower wordline only as needed to maintain the storage node voltage high when transitioning to active mode.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims. For example, n- an p- can be interchanged with an associated reversal of voltage polarities.

Modifications to the present innovations include power-up being done by columns, or rows, or by blocks of columns or rows, or by subarrays.

Likewise, the array can be implemented with blockwise (or subarray-wise) total power-off of columns containing no data (or at least power-down to the point where data is lost).

The innovative storage method could adapt to shared-BL accessed cells, or dual-port cells with quad BLs, or other BL arrangements.

Alternatively and less preferably, the innovations of the present application could be adapted to asymmetric cells.

The innovative array can also use segmented WL architectures for switching blocks between active and standby.

What is claimed is:

1. A 4T CMOS SRAM, comprising:

an array of memory cells, each including N-channel driver transistors cross-coupled to drive data nodes, and at least one P-channel pass transistor connected to drive a respective one of said data nodes;

at least one word line, which is connected to control said pass transistors of multiple ones of said cells, and at least one bit line, which provides external access to data nodes of said cells;

wherein, in an active mode, said word line is held at a first voltage for non-accessed cells;

and wherein, in a standby mode, said word line is held at a second voltage which is higher than said first voltage;

whereby leakage through said pass transistors is reduced in said standby mode.

2. An integrated circuit memory, comprising:

an array of memory cells, each including driver transistors cross-coupled to drive data nodes, and a pass transistor of opposite type to said driver transistors;

at least one word line, which is connected to control said pass transistors of multiple ones of said cells, and at least one bit line, which provides external access to data nodes of said cells;

wherein, in an active mode, said word line is held at least sometimes at a first voltage which permits rapid access to said data nodes;

and wherein, in a standby mode, said word line is held at least sometimes at a second voltage which reduces the leakage current through said pass transistors.

3. The integrated circuit memory of claim 2 wherein in said standby mode, said word line is held at least sometimes at a second voltage which reduces the leakage current through said pass transistors to only slightly greater than leakage current through said drive transistors.

4. An integrated circuit memory, having at least a standby mode and an active mode, comprising:

memory cells which each use transistor leakage current for data retention, and which are each connected to at least two conductors running in generally different directions; and voltage regulator circuitry which, during said standby mode but not during said active mode, regulates at least one of said conductors to a voltage at which said leakage current is approximately the minimum which will reliably retain data without read operations.

5. The integrated circuit of claim 4, wherein said conductors include word lines and column lines, and wherein said regulator regulates said word lines.

* * * * *